United States Patent [19]

McBride

[11] 4,408,155
[45] Oct. 4, 1983

[54] FAULT DETECTOR WITH IMPROVED RESPONSE TIME FOR ELECTRICAL TRANSMISSION SYSTEM

[75] Inventor: Joseph R. McBride, Mauldin, S.C.

[73] Assignee: Bridges Electric, Inc., Heber Springs, Ark.

[21] Appl. No.: 239,344

[22] Filed: Mar. 2, 1981

[51] Int. Cl.³ .................... G01R 31/02; G01R 19/00; G01R 29/16
[52] U.S. Cl. ...................................... 324/51; 324/107
[58] Field of Search .......................... 324/127, 107, 51

[56] References Cited

U.S. PATENT DOCUMENTS

| Re. 30,134 | 12/1979 | McClain . | |
|---|---|---|---|
| 2,774,890 | 12/1956 | Semmelman . | |
| 3,197,880 | 8/1965 | Rice . | |
| 3,312,898 | 4/1967 | Browne | 324/127 |
| 3,377,551 | 4/1968 | Ledoux . | |
| 3,418,575 | 12/1968 | Spindle | 324/127 X |
| 3,775,675 | 11/1973 | Freeze | 324/51 |
| 3,836,854 | 9/1974 | Wehman | 324/51 X |
| 4,053,876 | 10/1977 | Taylor . | |

FOREIGN PATENT DOCUMENTS

2845155  4/1980  Fed. Rep. of Germany ...... 324/127

OTHER PUBLICATIONS

National Semiconductors: LM119 Dual Comparator Data Sheet 1980 Linear Databook, 5–18.

*Primary Examiner*—Stanley T. Krawczewicz
*Assistant Examiner*—Jose M. Solis
*Attorney, Agent, or Firm*—Wood, Dalton, Phillips, Mason & Rowe

[57] ABSTRACT

A fault detector for an electrical transmission system and a remote current sensor for use therein. The remote current sensor includes a Hall effect transducer for measuring the magnetic field surrounding a conductor of the transmission system to thereby monitor the current flowing through the conductor. The transducer is positioned between a pair of tapered pole pieces for concentrating low density magnetic flux in the air into a high density magnetic flux focused onto the transducer. The pole pieces enable the sensor to be positioned a distance from the conductor which is greater than the electrical arcing distance so as to allow use of the air gap between the conductor and sensor as insulation. For a triangular configuration of conductors, two remote current sensors having orthogonal sensitive axes are positioned at a location equidistant from all three conductors. A first sensor measures only the magnetic field surrounding a first conductor whereas the second sensor measures the vector sum of the magnetic fields surrounding the second and third conductors. For a coplanar configuration of conductors, three remote current sensors are utilized. Each sensor is positioned radially outward from its associated conductor, the sensitive axis of each sensor being tangent to the magnetic field surrounding its conductor. The fault detector compares the highest positive sensor output and the least positive sensor output to respective set points enabling the detection of a fault within one quarter of a fault current cycle. If either set point is exceeded, a relay is actuated to provide a fault indication signal.

15 Claims, 8 Drawing Figures

FAULT DETECTOR WITH IMPROVED RESPONSE TIME FOR ELECTRICAL TRANSMISSION SYSTEM

BACKGROUND OF THE INVENTION

This invention relates to a fault detector for an electrical transmission system and a remote current sensor for use therein. The remote current sensor measures the magnetic field surrounding a conductor of the transmission system to monitor the current flowing through the conductor. The remote current sensor is positioned at a location sufficiently distant from the conductor to prevent electrical arcing from occurring without the use of an insulating material. The fault detector responds to the output of the remote current sensor to detect a fault within one quarter of the fault current cycle.

Fault detectors have been known in which a current transformer is used to monitor the current flowing through a conductor of an electrical transmission system. A current transformer typically requires an expensive insulating material such as porcelain to protect the transformer from electric fields. Fault detectors have also used a Hall effect transducer to monitor the current flowing through a conductor but alone the transducer is ineffective at distances from the conductor greater than the electrical arcing distance. At distances sufficiently close to the conductor to provide a meaningful measurement, the Hall effect transducer requires the same insulation as the current transformer to protect the transducer from electric fields.

Known fault detectors further require a full half-cycle of fault current to respond thereto. During the time required to detect a fault, costly equipment may be damaged. Additional problems arise in locating the fault after it has been cleared by the transmission system's interrupting devices.

SUMMARY OF THE INVENTION

In accordance with the present invention, the disadvantages of prior fault detectors have been overcome.

The fault detector includes a remote current sensor for measuring the magnetic field surrounding a conductor of an electrical transmission system to monitor the current flowing through the conductor. The current sensor is positioned at a remote location from the conductor. That is at a location sufficiently distant from the conductor to prevent electrical arcing from occurring without the use of an insulating material.

The remote current sensor includes a Hall effect transducer for measuring the magnetic field surrounding the conductor. The transducer is positioned between a pair of tapered pole pieces having a wide cross-sectional area at one end and a small cross-sectional area at the opposite end, adjacent to the transducer. The tapered pole pieces concentrate low density magnetic flux in the air into a high density magnetic flux focused onto the transducer enabling the detection of a magnetic field from a distance which is greater than the electrical arcing distance.

The conductors of a three phase electrical transmission system may be arranged in either a triangular configuration or a coplanar configuration. For a triangular configuration of conductors, two remote current sensors are utilized. A first remote current sensor is positioned so that its sensitive axis lies in the plane of the first and second conductors and is tangent to the magnetic field surrounding the third conductor. So positioned, the first current sensor measures the magnetic field due to the current flowing through the third conductor and is insensitive to the fields around the other conductors. The second remote current sensor is positioned so that its sensitive axis is perpendicular to the sensitive axis of the first remote current sensor and tangent to the magnetic fields surrounding the first and second conductors. So positioned, the second current sensor measures the vector sum of the magnetic fields due to the currents flowing through the first and second conductors and is insensitive to the field around the third conductor.

For a triangular configuration of conductors wherein the altitude is equal to one-half of the base, both of the current sensors are positioned at a location equidistant from all three conductors. This enables each of the sensor outputs to be compared to a single set point in determining the existence of a fault on the transmission line.

For a coplanar configuration of conductors, three remote current sensors are utilized. Each of the remote current sensors is positioned radially outward from its associated conductor, the sensitive axis of each sensor being tangent to the magnetic field surrounding its conductor.

Each of the remote current sensors is coupled to an amplifier through a capacitor which eliminates the effects of constant magnetic fields from the sensor output signals. A high signal selector selects the most positive amplified sensor signal to be compared with a first set point in order to detect a positive polarity fault current. A low signal selector selects the least positive amplified sensor signal to be compared with a second set point in order to detect a negative polarity fault current. Because the fault detector recognizes sensor signals corresponding to both positive and negative polarity fault currents, the detector can respond to a fault within one quarter of the fault current cycle.

If either of the first or second set points is exceeded by the amplified sensor signal, a relay is actuated to provide a fault indication signal. Means are provided to prevent the actuation of the relay due to transient signals which may arise when the fault detector power supply is lost or subsequently restored.

Further advantages of the invention will be readily apparent from the following specification and from the drawings, in which.

Figure 1:
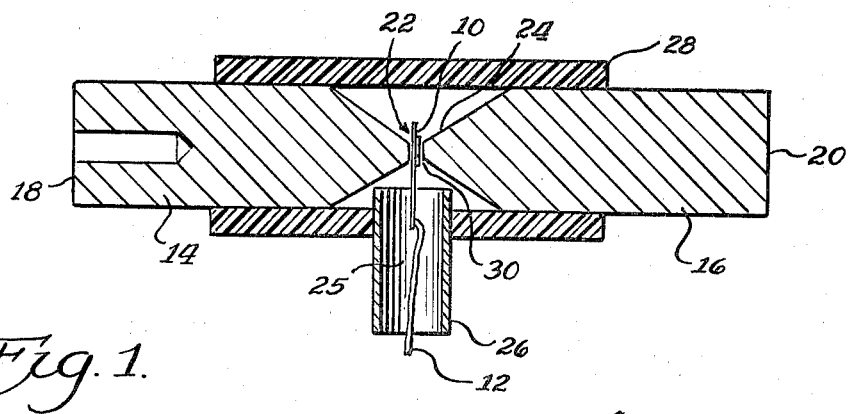
FIG. 1 is a cross-sectional view of a remote current sensor used in the fault detector of the present invention.

The fault detector of the present invention utilizes a remote current sensor as shown in FIG. 1 to measure the magnetic field surrounding a conductor of an electrical transmission system and thereby monitor the current flowing through the conductor. The current sensor is positioned at a remote location from the conductor. That is, at a location a distance from the conductor which is greater than the electrical arcing distance so as to eliminate the need for expensive insulating materials.

The remote current sensor includes a Hall effect transducer 10 for measuring the magnetic field surrounding a conductor. The Hall effect transducer should have high sensitivity, linearity, repeatability, and stability over a wide range of ambient temperatures. The Honeywell 92SS12-2 transducer is suitable. The magnetic field surrounding a conductor is proportional to i/d where i is the current flowing through the conductor and d is the distance between the conductor and the point of measurement. The output of the Hall effect transducer 10 is a voltage proportional to the magnetic field sensed and thus proportional to the current flowing through the conductor. The output voltage is provided by transducer 10 on lines 12 to the fault detector circuit for such purposes as identifying and locating fault currents, controlling the operation of circuit breakers, and accumulating operational data.

The remote current sensor is located at a distance from the conductor which is greater than the electrical arcing distance so as to allow use of the air gap between the conductor and the remote current sensor as insulation. For a 15,000 volt transmission line, the remote current sensor is located approximately 20" from the conductors and for a 138,000 volt line, the sensor is located approximately 60" from the conductors. These distances are sufficiently remote from the conductors to prevent electrical arcing from occurring without the use of an insulation material.

At such distances from the conductors, the magnetic flux density in the air is low and existing Hall effect transducers alone cannot accurately measure the magnetic field. In order to detect the low density magnetic flux at a remote location from the conductors, the Hall effect transducer 10 is positioned between a pair of pole pieces 14 and 16, made of a low hysteresis ferromagnetic material. The pole pieces 14 and 16 are tapered having a wide cross-sectional area at respective ends 18 and 20 and a small cross-sectional area at the opposite ends 22 and 24 adjacent to the transducer 10. The wide pole piece ends 18 and 20 collect low density magnetic flux in the air and focus the flux into a concentrated high density magnetic field between the small pole piece ends 22 and 24. The resulting magnetic field focused onto the Hall effect transducer is proportional to the magnetic field in the air but has a much higher density to enable the detection of the field from a remote location.

The Hall effect transducer 10 is mounted in a flexible silastic potting material 25 through the inner wall of a transducer sleeve 26. A sleeve 28 rigidly supports the pole pieces 14, 16 and the transducer sleeve 26 so that the magnetic field sensed is focused directly onto the sensitive area 30 of the transducer 10. The sleeve 28 is made of fiberglass or other insulating material in order to eliminate eddy currents which would arise if the sleeve were made of a conducting material. Eddy currents will produce an erroneous transducer output so that it is essential that such currents be eliminated.

Figure 2A:
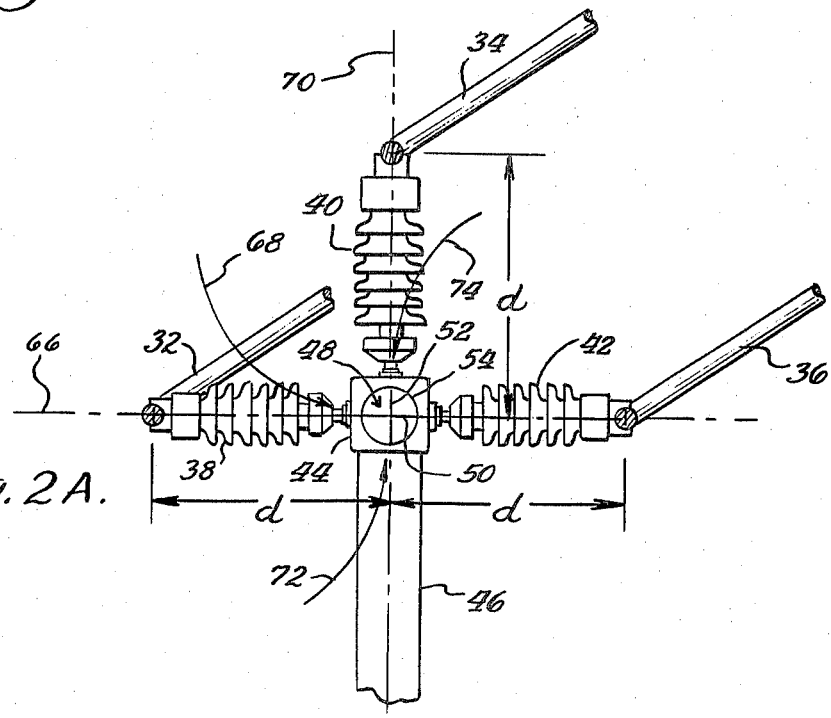
FIG. 2A illustrates the positioning of two current sensors used with a triangular configuration of conductors.
Figure 2B:
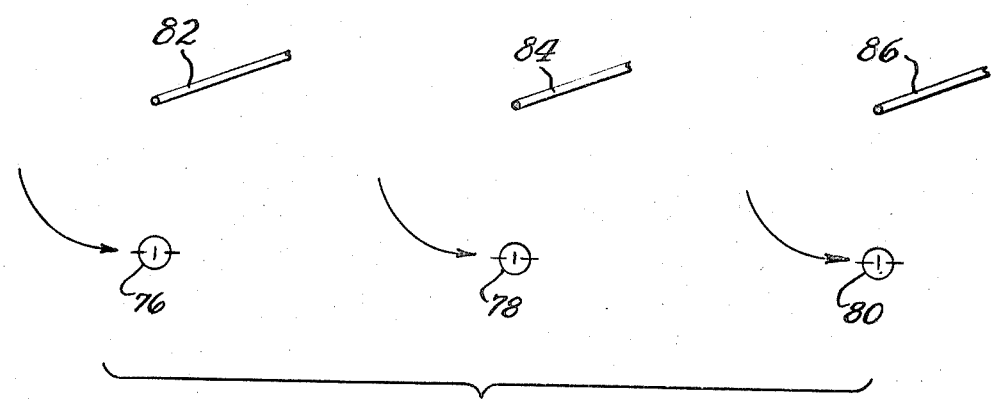
FIG. 2B illustrates the positioning of three current sensors used with a coplanar configuration of conductors.

The three phase conductors of an electrical transmission system may be arranged in either a triangular configuration as shown in FIG. 2A or in a coplanar configuration as shown in FIG. 2B. For a triangular configuration, overhead conductors 32, 34 and 36 are secured to respective insulators 38, 40 and 42 mounted on a box-like housing 44 which is supported by a pole 46. The box-like housing 44 may contain disconnect switches for the conductors as shown in Bridges U.S. Pat. No. 4,095,061. A current detector generally designated 48 includes two remote current sensors 50 and 52. The current detector 48 is mounted on a base 54 of the box-like housing 44. So mounted, the current sensors are at a sufficiently remote location from the conductors to prevent electrical arcing from occurring without the use of an insulating material.

Figure 3:
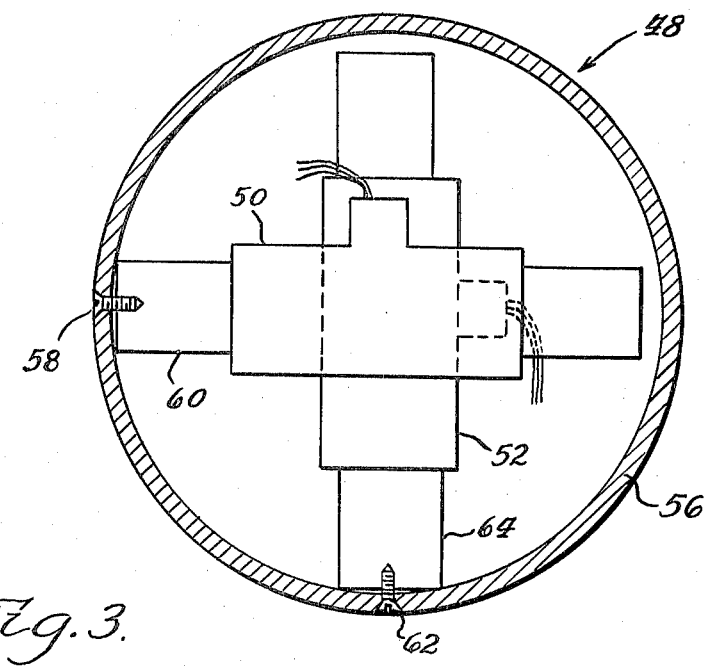
FIG. 3 is a cross-sectional view of the housing for the current sensors used with a triangular configuration of conductors.

The remote current sensors 50 and 52 of the current detector 48 are disposed within an electrically grounded cylindrical housing having a heavy aluminum wall 56 as shown in FIG. 3. The current sensor 50 is secured to the aluminum wall 56 by a screw 58 connected to a pole piece end 60. The current sensor 52 is secured to the aluminum wall 56 perpendicular to sensor 50 by a screw 62 connected to a pole piece end 64.

The aluminum housing of the current detector 48 is mounted on the base 54 so that the sensitive axis 66 of the remote current sensor 50 lies in the plane of conductors 32 and 36 and is tangent to the circular magnetic field 68 surrounding conductor 34. The remote current sensor 52 is positioned so that its sensitive axis 70 is perpendicular to the sensitive axis of sensor 50 and is tangent to the magnetic fields 72 and 74 surrounding conductors 32 and 36 respectively.

Only that field which is parallel to the sensitive axis of a remote current sensor is detected by the sensor so that sensor 50 measures the magnetic field surrounding conductor 34 and sensor 52 measures the magnetic fields surrounding conductors 32 and 36. Since the sensors 50 and 52 have orthogonal sensitive axes, each sensor is insensitive to the magnetic field detected by the other sensor. Sensor 50 is insensitive to the magnetic fields surrounding conductors 32 and 36, these fields intersecting the sensitive axis of sensor 50 at right angles since the sensitive axis of sensor 50 lies in the plane of conductors 32 and 36. Similarly, the magnetic field surrounding conductor 34 intersects the sensitive axis of the sensor 52 at right angles so that sensor 52 is insensitive to that field.

Since only one remote current sensor is used to measure the magnetic fields surrounding both of the conductors 32 and 36, sensor 52 should be positioned equidistant from both of the conductors 32 and 36 so as to be equally sensitive to the respective magnetic fields surrounding the conductors. For a triangular configuration of conductors having an altitude equal to one-half of the base as shown in FIG. 2A, both of the remote current sensors 50 and 52 are positioned equidistant from all three of the conductors 32, 34 and 36 so that the outputs of the sensors will be of the same order of magnitude. Further, fault currents are of a sufficiently higher magnitude than are load currents to enable the outputs of both of the sensors 50 and 52 to be compared to the same set point in determining the existence of a fault to be discussed in detail below in connection with the fault detector block diagram.

Figure 4:
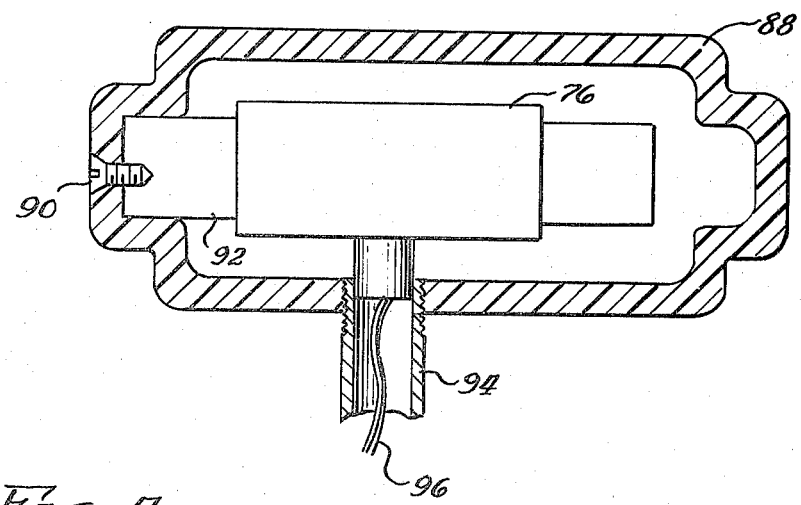
FIG. 4 is a cross-sectional view of a housing for an individual current sensor used with a coplanar configuration.

The coplanar configuration of conductors as shown in FIG. 2B utilizes three remote current sensors 76, 78 and 80 associated with respective conductors 82, 84 and 86. Each of the remote current sensors is mounted in an individual aluminum housing 88 as shown in FIG. 4 for sensor 76. The remote current sensor 76 is secured to the aluminum housing 88 by a screw 90 connected to a pole piece end 92. A steel pipe 94 is threadingly connected to the housing 88 and contains the leads 96 from the Hall effect transducer of sensor 76 connected to the fault detector circuit.

Each of the remote current sensors 76, 78 and 80 is positioned radially outwardly from its associated conductor, the sensitive axis of each sensor being tangent to the magnetic field surrounding its conductor. The remote current sensors are located at a distance from the conductors which is greater than the electrical arcing distance. Such distances allow the aluminum housing 88 for each sensor to be electrically grounded so that the air gap separating the sensors from the conductors may be used as insulation. Further, the distances separating each of the remote current sensors from their respective conductors should be equal so that the outputs of all three sensors may be compared to the same set point in determining the existence of a fault.

Although the remote current sensor 76 predominantly measures the magnetic field surrounding the conductor 82, the sensor is also affected by the magnetic fields due to the currents flowing through the conductors 84 and 86. Similarly, sensors 78 and 80 are affected by the magnetic fields due to the currents flowing through conductors other than their respectively associated conductors 84 and 86. The effects of the currents flowing through the other conductors on a particular remote current sensor may be compensated for by adjusting the set point in the fault detector to be discussed in detail below.

Figure 5:
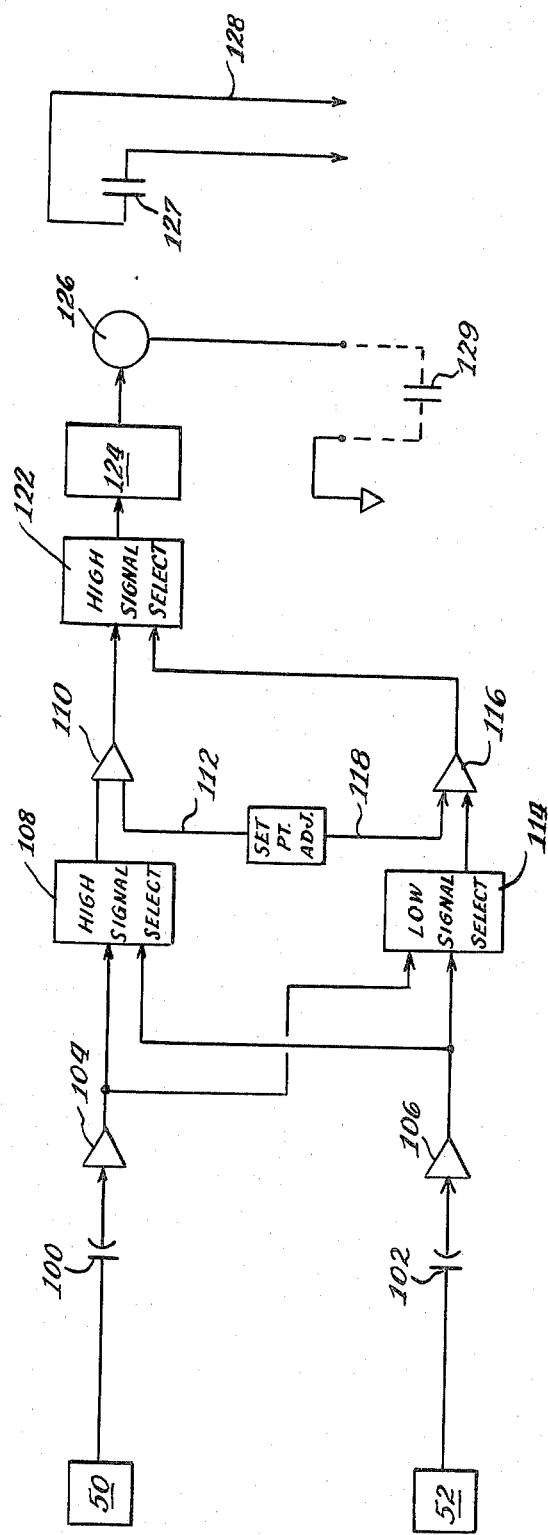
FIG. 5 is a block diagram of the fault detector with two current sensors.

A block diagram of the fault detector is shown in FIG. 5 having two remote current sensors 50 and 52 as would be used with a triangular configuration of conductors. The block diagram is equally applicable to a fault detector used with a coplanar configuration of conductors. The only difference being the addition of a third remote current sensor and associated amplifier.

In order to provide an accurate measurement of the magnetic fields due to the currents flowing through the conductors of an electrical transmission system, the effects of the earth's magnetic field must be eliminated from the output signals of the remote current sensors 50 and 52. The earth's magnetic field is relatively constant as opposed to the magnetic field surrounding a conductor of an electrical transmission system which varies at a 60 cycle rate. Capacitors 100 and 102 coupled to the respective outputs of sensors 50 and 52 effectively eliminate the D.C. component of the sensor signal attributable to a constant magnetic field such as the earth's field. Only the A.C. components of the sensor signals are passed by capacitors 100 and 102 to respective amplifiers 104 and 106 so that the amplified signals accurately reflect the magnetic field due solely to the current flowing through the conductors.

The outputs of amplifiers 104 and 106 are the amplified A.C. sensor voltage superimposed upon a steady state D.C. voltage. Depending upon the value at which the steady state D.C. voltage of the amplifier is set, the negative half-cycle of the amplified sensor signal may have a positive value. Therefore, a reference to a negative half-cycle of the amplified sensor signal connotes a negative half-cycle with respect to the steady state D.C. voltage of the amplifier output.

Figure 6:
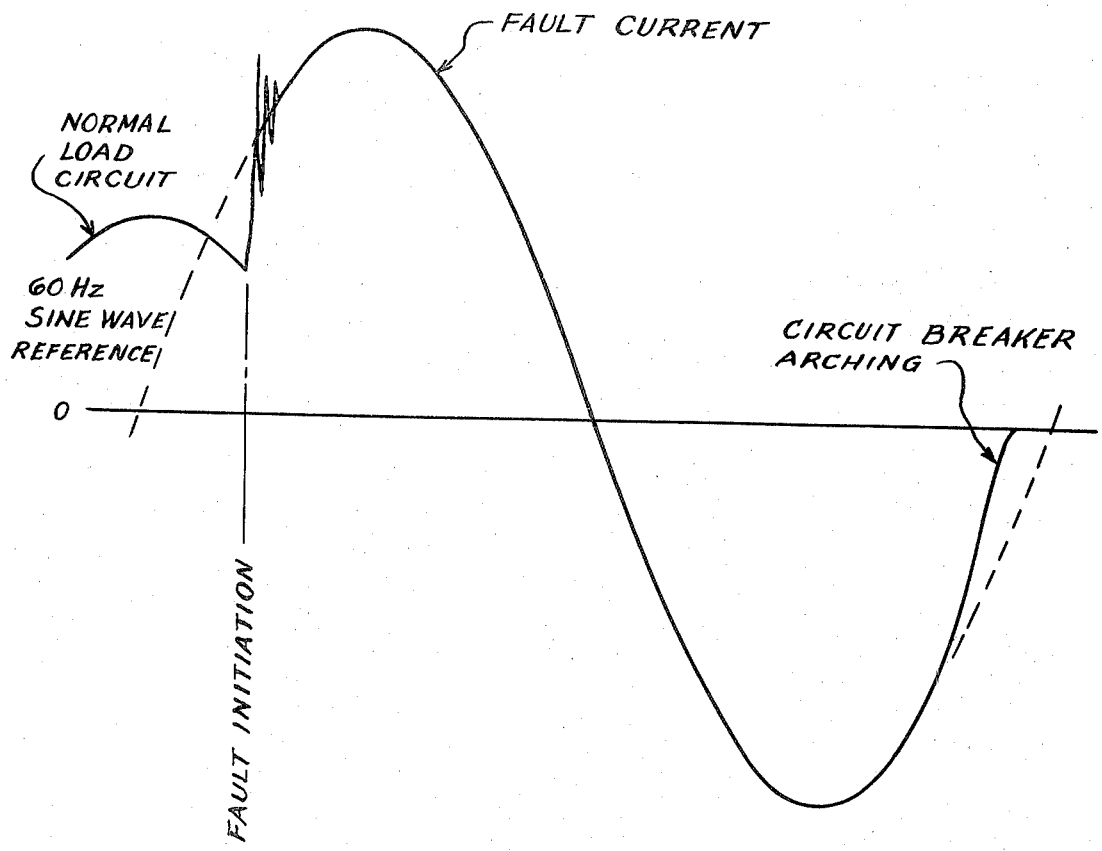
FIG. 6 is a graphical illustration of a fault current.

One application of the fault detector is the identification and location of a fault current as shown in FIG. 6. A fault current may result from a short circuit between a conductor and ground or between any two or all three conductors. Interrupting devices in the transmission line will typically clear a fault in one half-cycle of a 60 cycle power frequency to prevent the high currents from damaging costly equipment. In order to provide a fault indication so that the fault may be located before being cleared, the fault detector recognizes both positive and negative polarity fault currents within one quarter of a cycle.

A high signal selector 108 selects the higher positive amplified sensor signal from either of amplifiers 104 or 106 and passes it to a comparator 110. If the higher positive amplified sensor signal exceeds a set point which is input to the comparator 110 on a line 112, then the output of comparator 110 goes high, indicating a fault occurring during the positive half-cycle of the current. A low signal selector 114 selects the least positive amplified sensor signal to be passed to a comparator 116. If the least positive amplified sensor signal is less than a set point which is input to the comparator 116 on a line 118, the output of comparator 116 goes high, indicating a fault occurring during the negative half-cycle of current. Since faults occurring during both the positive and negative half-cycles of current are recognized by respective comparators 110 and 116, the fault detector can provide a fault indication within approximately one quarter of the fault current cycle before the fault is cleared by an interrupting device.

It is noted that the higher positive amplified sensor signal is compared to a single set point, which is input to comparator 110 on line 112, regardless of which of the sensors 50 or 52 the signal originates from. Similarly, a single set point is compared to the least positive amplified sensor signal by the comparator 116 regardless of which of the sensors 50 or 52 the signal originates from. As discussed in connection with FIG. 2A for a triangular configuration of conductors, the flux conditions on the remote current sensor 50 and 52 are different. Due to the orthogonal orientation of the sensitive axes of the sensors 50 and 52, sensor 50 detects only the magnetic field surrounding conductor 34, whereas sensor 52 detects the vector sum of the magnetic fields surrounding conductors 32 and 36. Even through the flux conditions on each of the sensors 50 and 52 are different, a single set point may be used for comparison to either of the amplified sensor signal outputs because of the specific arrangement of the sensors with respect to the conductors as shown in FIG. 2A.

For a triangular configuration of conductors having an altitude which is equal to one-half of the base, sensors 50 and 52 are both positiioned equidistant from all three of the conductors 32, 34 and 36. Since sensors 50 and 52 are positioned equidistant from the conductors, even though the magnetic flux conditions in each of the sensors are different, the outputs of sensors 50 and 52 will be of the same order of magnitude. Fault currents are of a sufficiently higher magnitude than are load currents so that a sensor output corresponding to a load current may be distinguished from a sensor output corresponding to a fault current using a single set point for comparison with the outputs from either of the sensors 50 or 52. A set point adjustment 120 is adjusted so that the maximum output from sensor 50 corresponding to a load current flowing through the conductor 34 will be ignored by comparators 110 and 116, but the minimum output from sensor 52 corresponding to a line-to-ground fault on either of the conductors 32 and 36 will be detected.

For a copolanar configuration of conductors, the distances separating each of the remote current sensors from their respective conductors are equal so that the outputs of each of the remote current sensors 76, 78 and 80 will be of the same order of magnitude to enable use of a single set point. In adjusting the set point adjustment 120 for use with a coplanar arrangement of conductors, the vector sum of the magnetic fields detected by a single sensor should be determined to account for the effects of currents flowing through all three conductors on the sensor.

When either of the outputs of comparators 110 or 116 goes high indicating a fault, a high signal selector 122 actuates a switching transistor 124. When turned on, the switching transistor 124 conducts, drawing current through a high speed relay 126, thereby setting the relay. When relay 126 is set, its contacts 127 close to provide a fault indication signal on lines 128. The fault indication signal may be transmitted on lines 128 to a supervising station which monitors the electrical transmission system. At the supervising station, the fault indication signal can be used to locate the fault or it can be used to accummulate operational data. The fault indication signal provided on line 128 may also be used to actuate circuit breakers in order to protect the equipment of the electrical transmission from damaging fault currents.

In order to reset the relay 126 after a fault has been identified, a relay contact 129 is closed causing current to flow through the relay in a direction opposite to the direction of current which sets the relay.

Figure 7:
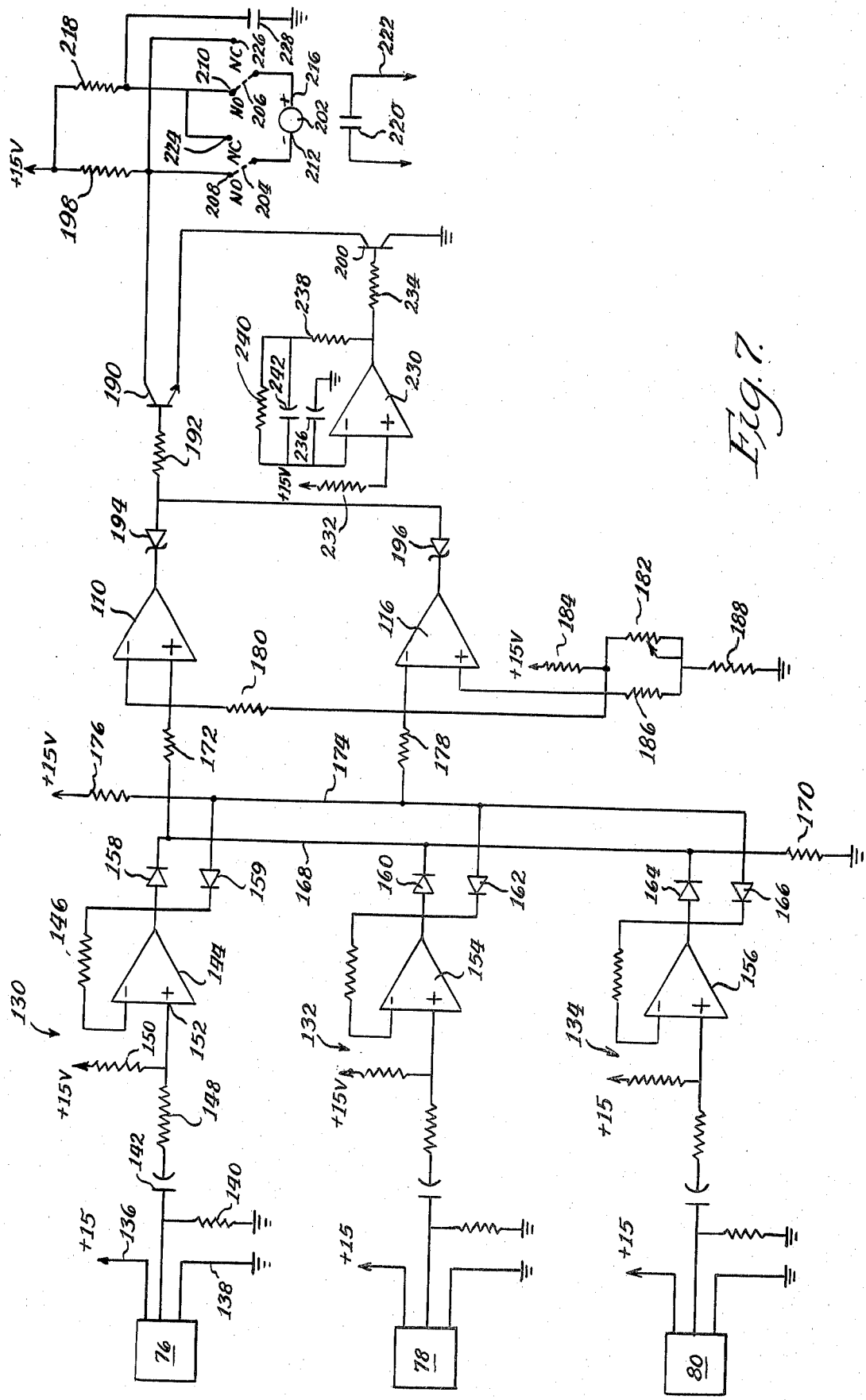
FIG. 7 is a schematic diagram of the fault detector circuit with three current sensors.

FIG. 7 is a detailed schematic of the fault detector block diagram of FIG. 5 having an additional remote current sensor. For a coplanar configuration of conductors, three remote current sensors 76, 78 and 80 are used having associated amplifier circuits 130, 132 and 134. Where only two remote current sensors are used as in conjunction with a triangular configuration of conductors, the only difference in the fault detector circuit is the elimination of one of the amplifier circuits.

The amplifier circuits associated with each of the remote current sensors are identical so that only the amplifier circuit 130 associated with sensor 76 will be discussed. A 15+V power supply provides the Hall effect transducer of the remove current sensor 76 with the proper biasing voltage on a line 136, line 138 being connected to ground. The transducer output voltage appears across a resistor 140 and is proportional to the magnetic field surrounding the conductor 82 and thus proportional to the current flowing through the conductor. A capacitor 142 provides A.C. coupling to an amplifier 144, the D.C. component of the sensor signal associated with the earth's constant magnetic field being eliminated thereby. The gain of amplifier 144 is determined by the ratio of a feedback resistor 146 to the value of a resistor 148. The steady state D.C. output voltage of amplifier 144 is set by the values of the resistor 148 and a bias resistor 150. In the presence of an alternating magnetic field, the output of the remote current sensor 76 is an A.C. voltage which is input to the noninverting terminal 152 of amplifier 144. The output of amplifier 144 is the amplified A.C. voltage from sensor 76 superimposed upon the steady state D.C. output voltage of amplifier 144.

Each of the amplified sensor signals which is output from amplifiers 144, 154 and 156 is applied to a respective pair of oppositely poled diodes 158, 159; 160, 162; and 164, 166. Diodes 158, 160 and 162 have anodes connected to the outputs of the amplifiers and cathodes tied together by line 168 connected to ground through a resistor 170 acting as the high signal selector 108 to pass the highest positive amplified sensor signal to the noninverting input terminal of comparator 110 through a resistor 172. The diodes 159, 162 and 166 have cathodes connected to the outputs of respective amplifiers 144, 154 and 156 and anodes tied together by line 174 connected to the +15 V power supply through a resistor 176 acting as the low signal selector 114 to pass the least positive amplified sensor signal to the inverting input terminal of the comparator 116 through a resistor 178.

Comparator 110 compares the highest positive amplified sensor voltage, selected by diodes 158, 160 and 164, to a set point voltage applied to the inverting input terminal of the comparator through a resistor 180. The set point voltage is taken from the positive end of a potentiometer 182 connected to the +15 V power supply through a resistor 184. If the highest positive amplified sensor voltage is greater than the set point, the output of comparator 110 goes high indicating a positive polarity fault current.

Comparator 116 compares the least positive amplified sensor voltage, selected by diodes 159, 162 and 166, to a set point voltage applied to the noninverting input terminal of the comparator through a resistor 186. The set point voltage is taken from the negative end of potentiometer 182 connected to ground through a resistor 188. If the least positive amplified sensor voltage is less than the set point, the output of comparator 116 goes high indicating a negative polarity fault current. The potentiometer 182 is adjusted so that the set point voltages applied to the comparators 110 and 116 will only be exceeded by an amplified sensor voltage indicating a fault current as discussed in connection with FIG. 5.

The outputs of comparators 110 and 116 are connected to the base of a switching transistor 190 through a resistor 192 and respective zener diodes 194 and 196. The zener diodes act as the high signal selector 122 and select the higher of the outputs from comparators 110 and 116 to be applied to the base of transistor 190. When load currents flow through the conductors of an electrical transmission system, the amplified sensor voltages are such that the highest positive amplified voltage is less than the set point voltage applied to comparator 110 and the least positive amplified voltage is greater than the set point voltage applied to comparator 116. Under these conditions, the outputs of comparators 110 and 116 are saturated at +1 V. Because of a 6 V drop across each of the zener diodes 194 and 196, the normally low comparator outputs are insufficient to turn on the switching transistor 190. However, when a fault current occurs, the set point voltage will be exceeded in either the positive or negative sense by the highest positive amplified sensor voltage or the least positive amplified sensor voltage so that the output of the respective comparator jumps from +1 V to +14 volts turning on transistor 190. The collector of transistor 190 is connected to the +15 V power supply through a resistor 198 and the emitter of transistor 190 is connected to ground through a second transistor 200 to be described in detail below. If transistor 200 is turned on, a high output from either of comparators 110 or 116 turns on transistor 190 causing the transistor to conduct through transistor 200.

A magnetic latching reed relay 202 is connected between the +15 V power supply and the collector of transistor 190 by means of switches 204 and 206. The switches 204 and 206 provide for the selection of a normally open relay or a normally closed relay. When switches 204 and 206 are in the position shown contacting terminals 208 and 210 respectively, the negative terminal 212 of relay 202 is connected between the collector of transistor 190 and the +15 V power supply through the resistor 198, the positive terminal 216 of the relay being connected to the +15 V power supply through a resistor 218. Relay contact 220 is normally open. If transistors 190 and 200 are turned on indicating the detection of a fault current, transistor 190 conducts through transistor 200 thereby drawing current through relay 202 in the direction to set the relay and close the relay contact 220. When the relay contact 220 is closed, a fault indication signal is provided on lines 222 to a supervising station for the electrical transmission system. The supervising station may use the fault indication signal to locate the fault on the transmission line or to accumulate operational data for the system.

When switches 204 and 206 contact terminals 224 and 226, the negative terminal 212 of relay 202 is connected to the +15 V power supply through the resistor 218 and the positive terminal 216 of the relay is connected between the collector of transistor 190 and the +15 V power supply through the resistor 198. The relay contact 220 is normally closed. When the transistor 190 conducts through transistor 200, current will be drawn through relay 202 in the direction to open the relay contact 220. With switches 204 and 206 contacting terminals 224 and 226 so that the relay contact 220 is normally open, the relay may be used to control interrupting devices which open upon detection of a fault current.

Once relay 202 is set, the relay contact 220 will remain latched in a closed (or open) position until the fault indication signal is acknowledged by resetting relay 202. A reset contact 228 is connected between the +15 V power supply through the resistor 218 and ground. When contact 228 is momentarily closed, current passes through relay 202 in a direction opposite to the direction of current which sets the relay thereby opening (or closing) the relay contact 220.

The Hall effect transducer used in the remote current sensor has a regulated output which is independent of a power supply of +8 V D.C. or greater. However, when the power supply is below 8 volts, transient sensor signals result. When the power supply is lost, the output of the Hall effect transducer drops, producing a transient sensor signal of the same order of magnitude as a sensor signal indicating a negative polarity fault current. Similarly, when the power supply is restored, the output of the transducer rises until the power supply voltage has increased to +8 V, producing a transient sensor signal of the same order of magnitude as a sensor signal indicating a positive polarity fault current. In order to prevent an erroneous fault indication due to a transient sensor signal, the actuation of transistor 200 is delayed thereby preventing transistor 190 from conducting and setting the relay 202.

A time delay amplifier 230 is connected between the +15 V power supply through a resistor 232 and the base of the transistor 200 through a resistor 234. The appropriate time delay is provided by a capacitor 236 connected between the inverting input terminal of amplifier 230 and ground and a feedback circuit comprised of a feedback resistor 238 in series with the parallel combination of a resistor 240 and a capacitor 242. When the +15 V power supply is lost, the output of the amplifier 230 drops sufficiently low to turn off transistor 200 before a transient sensor signal can turn on transistor 190, thereby preventing the actuation of relay 202. When the +15 V power supply is restored, the output of the amplifier 230, a ramped voltage rising to +2 V within approximately 2 seconds, delays the actuation of the transistor 200. The delay is sufficient to prevent transistor 190 from conducting through transistor 200 and actuating the relay 202 due to a transient sensor signal.

The power supply for the fault detector may be powered by the transmission line which the fault detector is monitoring. A fault on the transmission line may cause the loss of the power supply at the instant it is essential that the fault detector be operating to identify and locate the fault. In order to maintain the D.C. output voltage of the power supply above the minimum level required for the detector to operate, the power supply should include sufficient storage capacity. Large filter capacitors in the power supply will provide a slow rate of decay of the D.C. voltage to allow the fault detector to operate for a time sufficient to provide a fault indication to the supervisory program before operating power is completely lost.

I claim:

1. In a fault detector for an electrical transmission system having a conductor through which an alternating current flows and a sensor for monitoring the current flowing through said conductor, said sensor having an A.C. output signal proportional to the current and having positive and negative half cycles, an improved means for detecting a fault within one quarter of a fault current cycle, comprising:
    a high signal selecting means for selecting the positive half cycle of said sensor signal;
    means for comparing the signal selected by said high signal selector to a first reference signal;
    a low signal selecting means for selecting the negative half cycle of said sensor signal;
    means for comparing the signal selected by said low signal selector to a second reference signal; and
    means for providing a fault indication signal if the signal selected by said high signal selector exceeds said first reference signal or if the signal selected by said low signal selector is less than said second reference signal.

2. The fault detector of claim 1 further including means for eliminating the effects of a constant magnetic field from the output signal of said sensor.

3. The fault detector of claim 2 wherein the means for eliminating the effects of a constant magnetic field includes a capacitor coupled to the output of said sensor.

4. The fault detector of claim 1 for an electrical transmission system having a plurality of conductors and a plurality of sensors wherein said high signal selecting means selects the highest positive output signal from said sensors and said low signal selecting means selects the least positive output signal from said sensors.

5. The fault detector of claim 4 wherein said high signal selecting means includes a plurality of diodes, each of said diodes having an anode connected to one of said sensor outputs, the cathodes of said diodes being tied together and connected to the comparing means for said first reference signal.

6. The fault detector of claim 4 wherein said low signal selecting means includes a plurality of diodes, each of said diodes having a cathode connected to one of said sensor outputs, the anodes of said diodes having tied together and connected to the comparing means for said second reference signal.

7. The fault detector of claim 1 further including a means for supplying operating power to said fault detector and means to prevent a false indication of a fault due to transient signals resulting from the loss or restoration of said operating power.

8. The fault of detector of claim 7 wherein said means to prevent a false fault indication includes:
   a first switching means responsive to said comparing means for actuating said fault indication means if either said first reference signal is exceeded in the positive sense or said second reference signal is exceeded in the negative sense; and
   a second switching means connected to said first switching means for preventing said first switching means from actuating said fault indication means when either of said first or second reference signals is exceeded by a transient signal.

9. The fault detector of claim 8 wherein said second switching means includes a time delay amplifier connected to the means for supplying operating power.

10. A current detector for a three phase transmission line having first, second and third parallel conductors disposed in a triangular configuration comprising:
   a first current sensor for measuring a magnetic field surrounding the first conductor, said sensor having a sensitive axis in a plane parallel to a plane of the second and third conductors and tangent to the magnetic field surrounding said first conductor; and
   a second current sensor for measuring the magnetic fields surrounding the second and third conductors, said second sensor having a sensitive axis perpendicular to the sensitive axis of the first current sensor and tangent to the magnetic fields surrounding said second and third conductors.

11. The current detector of claim 10 wherein said second current sensor is positioned at a location equidistant from each of said first and second conductors.

12. The current detector of claim 10 for a three phase transmission line having first, second and third parallel conductors disposed in a triangular configuration such that a plane perpendicular to each of said conductors intersects the conductors at points forming the vertices of a triangle, said triangle having a base and an altitude equal to one-half of said base, wherein said first and second current sensors are positioned at a location equidistant from each of said first, second and third conductors.

13. The current detector of claim 12 wherein said first current sensor provides a sensor signal output proportional to the magnetic field surrounding said first conductor and said second current sensor provides a sensor signal output proportional to the vector sum of the magnetic fields surrounding said second and third conductors.

14. The current detector of claim 13 further including means responsive to the output signals of said first and second current sensors for detecting a fault on said transmission line.

15. The current detector of claim 14 wherein said fault detecting means includes:
   means for comparing the output signals from said first and second current sensors to a single reference signal; and
   means for providing a fault indication signal if either of the output signals from said first or second current sensor exceeds the reference signal.

* * * * *